United States Patent
Zhang et al.

(10) Patent No.: US 9,779,949 B2
(45) Date of Patent: Oct. 3, 2017

(54) ARRAY SUBSTRATE, DISPLAY DEVICE, AND MANUFACTURING METHOD OF ARRAY SUBSTRATE

(71) Applicant: BOE TECHNOLOGY GROUP CO., LTD., Beijing (CN)

(72) Inventors: Feng Zhang, Beijing (CN); Zhanfeng Cao, Beijing (CN); Qi Yao, Beijing (CN); Jingxia Gu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/428,863

(22) PCT Filed: May 28, 2014

(86) PCT No.: PCT/CN2014/078702
§ 371 (c)(1),
(2) Date: Mar. 17, 2015

(87) PCT Pub. No.: WO2015/109710
PCT Pub. Date: Jul. 30, 2015

(65) Prior Publication Data
US 2016/0035573 A1  Feb. 4, 2016

(30) Foreign Application Priority Data
Jan. 24, 2014 (CN) .......................... 2014 1 0036343

(51) Int. Cl.
H01L 27/14 (2006.01)
H01L 29/04 (2006.01)
(Continued)

(52) U.S. Cl.
CPC .......... *H01L 21/283* (2013.01); *G02F 1/1368* (2013.01); *G02F 1/13439* (2013.01);
(Continued)

(58) Field of Classification Search
CPC . H01L 21/283; H01L 21/124; H01L 27/1288; H01L 29/45; G02F 1/134363; G02F 1/13439; G02F 1/1368
(Continued)

(56) References Cited

U.S. PATENT DOCUMENTS 6,506,617 B1    1/2003  Cheng
2001/0007779 A1*  7/2001  Lee .................. G02F 1/134363
                                                                            438/30
(Continued)

FOREIGN PATENT DOCUMENTS

CN    102087450 A    6/2011
CN    102903675 A    1/2013
(Continued)

OTHER PUBLICATIONS

Oct. 20, 2015—(CN)—First Office Action Appn 201410036343.3 with English Tran.
(Continued)

*Primary Examiner* — Dzung Tran
(74) *Attorney, Agent, or Firm* — Banner & Witcoff, Ltd.

(57) ABSTRACT

An array substrate is provided, wherein a pixel electrode has the same material as a source/drain and has a thickness less than that of the source/drain, or a common electrode has the same material as a gate and has a thickness less than that of the gate, which guarantees transmittance of the array substrate while reducing the process complexity. A display device and a manufacturing method of the array substrate are also provided.

18 Claims, 5 Drawing Sheets

(51) Int. Cl.
  *H01L 29/66* (2006.01)
  *H01L 27/12* (2006.01)
  *H01L 21/283* (2006.01)
  *G02F 1/1343* (2006.01)
  *G02F 1/1368* (2006.01)
  *H01L 29/45* (2006.01)

(52) U.S. Cl.
  CPC ...... *G02F 1/134363* (2013.01); *H01L 27/124* (2013.01); *H01L 27/1288* (2013.01); *H01L 29/45* (2013.01); *G02F 2001/134372* (2013.01)

(58) Field of Classification Search
  USPC ...... 257/72, 59, 192, 347, E29.273, E21.41; 438/158, 30, 151; 349/141
  See application file for complete search history.

(56) References Cited

U.S. PATENT DOCUMENTS

| | | | | |
|---|---|---|---|---|
| 2002/0085156 | A1* | 7/2002 | Lee | G02F 1/134363 349/141 |
| 2004/0119928 | A1* | 6/2004 | Niwano | G02F 1/134363 349/141 |
| 2005/0078246 | A1* | 4/2005 | Yoo | G02F 1/1362 349/122 |
| 2006/0146256 | A1* | 7/2006 | Ahn | G02F 1/134309 349/141 |
| 2010/0022055 | A1* | 1/2010 | Bae | H01L 27/124 438/158 |
| 2012/0107982 | A1* | 5/2012 | Song | H01L 27/1214 438/30 |

FOREIGN PATENT DOCUMENTS

| | | |
|---|---|---|
| CN | 103474434 A | 12/2013 |
| CN | 103779357 A | 5/2014 |
| KR | 100494709 B1 | 6/2005 |

OTHER PUBLICATIONS

Oct. 28, 2014 (CN) International Search Report and Written Opinion for PCT/CN2014/078702.

Oct. 28, 2014 (CN) Written Opinion for PCT/CN2014/078702—Eng Tran.

Feb. 29, 2016—(CN)—Second Office Action Appn 201410036343.3 with English Tran.

* cited by examiner

ARRAY SUBSTRATE, DISPLAY DEVICE, AND MANUFACTURING METHOD OF ARRAY SUBSTRATE

The application is a U.S. National Phase Entry of International Application No. PCT/CN2014/078702 filed on May 28, 2014, designating the United States of America and claiming priority to Chinese Patent Application No. 201410036343.3 filed on Jan. 24, 2014. The present application claims priority to and the benefit of the above-identified applications and the above-identified applications are incorporated by reference herein in their entirety.

TECHNICAL FIELD

Embodiments of the present disclosure relate to an array substrate, a display device comprising the array substrate and a method for manufacturing the array substrate.

BACKGROUND

Thin film transistor liquid crystal displays (TFT-LCDs) are characterized in small volume, low power consumption and free of irradiation and dominate the market of flat-panel displays currently. With the advanced super dimension switch technology (ADS), a fringe electric field is generated by electrodes between pixels in the same plane to enable aligned liquid crystal molecules disposed between electrodes and right above electrodes to rotate in the plane direction (parallel to the substrate), which increases the viewing angle while enhancing light transmittance of the liquid crystal layer.

Figure 1:
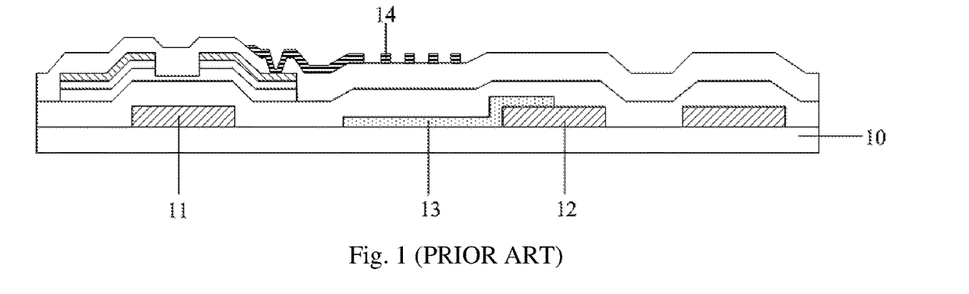
FIG. 1 is a schematic structural view of an array substrate known by the inventor.

FIG. 1 is a schematic structural view of an array substrate of ADS mode liquid crystal display known by the inventor. The array substrate is completed on a glass substrate by 5 masking processes from bottom to top, including a masking for fabricating common electrodes 13 on the glass substrate 10, a masking for fabricating gates 11 and common electrode connecting lines 12, a masking for fabricating an active layer and source/drain and a masking for fabricating vias in passivation layer and a masking for fabricating pixel electrodes 14.

As known by the inventor, the common electrodes 13 and the gates 11 are fabricated by two masking processes, respectively by transparent conductive metal oxide film and metal materials, which is relatively complex and at high costs.

SUMMARY

Embodiments of the present disclosure provide an array substrate and a manufacturing method of the array substrate to simplify the manufacturing processes of the array substrate and improve the display effect of the array substrate.

An array substrate comprises a gate, a common electrode, a source/drain and a pixel electrode, wherein the gate and the common electrode are disposed in a same layer or the source/drain and the pixel electrode are disposed in a same layer, When the gate and the common electrode are disposed in the same layer, the common electrode and the gate are manufactured with a same material and the common electrode has a thickness less than that of the gate, the common electrode is formed with a plurality of slits, and the common electrodes has a transmittance greater than 30%;

when the source/drain and the pixel electrode are disposed in the same layer, the pixel electrode and the source/drain are manufactured with a same material and the pixel electrode has a thickness less than that of the source/drain, the pixel electrode is formed with a plurality of slits, and the pixel electrode has a transmittance greater than 30%.

Since the gate and the common electrode are made of the same material, it is possible to reduce process complexity. The common electrode with a thickness less than that of the gate guarantees the transmittance of the common electrode. Furthermore, it is possible to manufacture the gate and the common electrode in the same layer by one dual-tone mask, or manufacture the source/drain and the pixel electrode in the same layer by one dual-tone mask, which saves one mask and reduces process complexity and process costs.

In one embodiment of the present disclosure, the gate material or source/drain material can be a single-layer metal film or a multi-layer composite film of Al, Cu, Mo, AlNd, Cr, Ti, Ag or a composite film with a metal/medium one-dimension photonic crystal structure.

In one embodiment of the present disclosure, in order to obtain a better transmittance, the gate material is a single-layer metal film of Ag, and the gate has a thickness of 2000 Å, the common electrode has a thickness of 50 Å.

In one embodiment of the present disclosure, in order to obtain a better transmittance, the gate material is a composite film comprising ZnS, Ag, ZnS, and Ag, wherein ZnS, Ag, znS and Ag are disposed in sequence in a direction from the substrate to the composite film, and ZnS, Ag, ZnS and Ag in the gate has a thicknesses of 400 Å, 180 Å, 400 Å and 2000 Å respectively, the common electrode just comprises a composite layers of ZnS, Ag and ZnS with a thickness of 400 Å, 180 Å and 400 Å respectively.

In one embodiment of the present disclosure, the common electrode or the pixel electrode has a thickness of 10~100Å and a transmittance of 30%~90%.

In one embodiment of the present disclosure, in order to reduce storage capacitance between the common electrode and the pixel electrode, each of the common electrode and the pixel electrode is formed with a plurality of slits and slits in the common electrode and slits in the pixel electrode are parallel to each other.

In one embodiment of the present disclosure, in order to further reduce the storage capacitance between the common electrode and the pixel electrode, projections of slits in the common electrode on the substrate and projections of slits in the pixel electrode on the substrate do not overlap.

At least one embodiment of the present disclosure further provides a method for manufacturing an array substrate comprising:

depositing a source/drain material;

forming patterned photoresist on the source/drain material by a dual-tone mask;

after forming the source/drain pattern through etching, thinning the photoresist by an ashing process to expose the source/drain material in a pixel electrode region;

forming a pixel electrode pattern by etching again.

The source/drain and the pixel electrode are manufactured by one masking, hence one mask is saved and the manufacturing process of the array substrate is simplified.

At least one embodiment of the present disclosure further provides a manufacturing method of an array substrate comprising:

depositing a gate material on a substrate;

forming patterned photoresist on the gate material by a dual-tone mask;

after forming the gate pattern through etching, thinning the photoresist by an ashing process to expose gate material in a common electrode region;

forming a common electrode pattern by etching again.

Since the gate and the common electrode are manufactured by one masking, hence one mask is saved and the manufacturing process of the array substrate is simplified.

At least one embodiment of the present disclosure further provides a display device comprising the above-mentioned array substrate.

With an array substrate, a display device and a manufacturing method of the array substrate according to at least one embodiment of the present disclosure, the pixel electrode has the same material as the source/drain and has a thickness less than that of the source/drain, or the common electrode has the same material as the gate and has a thickness less than that of the gate, thereby ensuring transmittance of the array substrate while decreasing process complexity.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

At least one embodiment of the present disclosure provides an array substrate, a display device and a manufacturing method of the array substrate in which a pixel electrode has the same material as a source/drain and has a thickness less than that of the source/drain, or a common electrode has the same material as a gate and has a thickness less than that of the gate, thereby ensuring transmittance of the array substrate while decreasing process complexity.

Figure 2A:
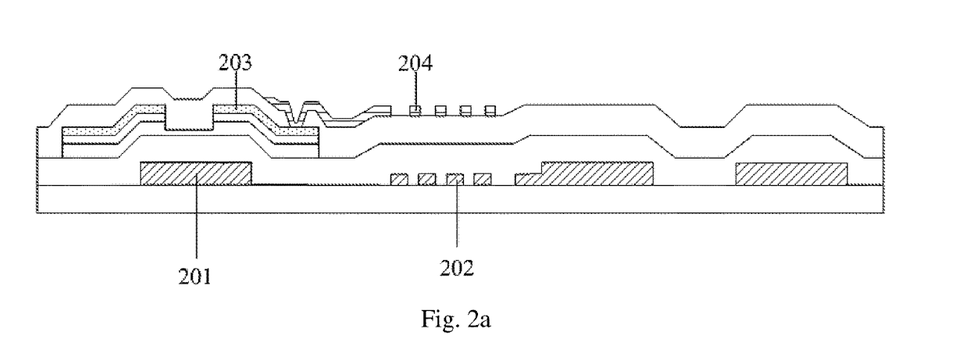
FIGS. 2a and 2b are schematic structural views of an array substrate according to one embodiment of the present disclosure.
Figure 2B:
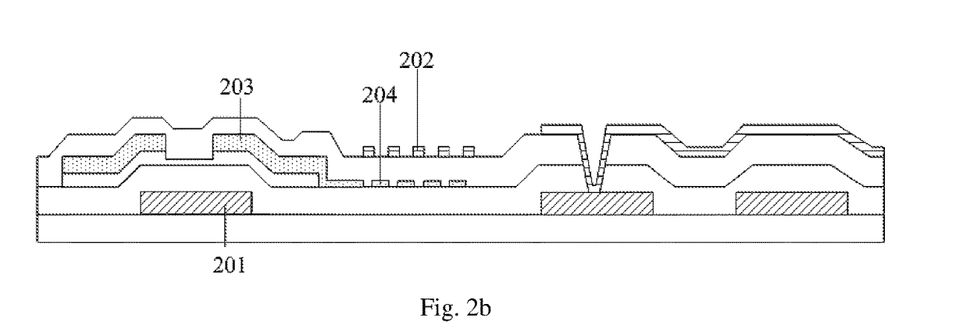

As illustrated in FIG. 2a or 2b, an array substrate according to one embodiment of the present disclosure comprises a gate 201, a common electrode 202, a source/drain 203 and a pixel electrode 204, wherein the gate 201 and the common electrode 202 are disposed in the same layer or the source/drain 203 and the pixel electrode 204 are disposed in the same layer, when the gate 201 and the common electrode 202 are disposed in the same layer, they are manufactured with the same material, and the common electrode 202 has a thickness less than that of the gate 201, the common electrode 202 are formed with a plurality of slits and has a transmittance greater than 30%; when the source/drain 203 and the pixel electrode 204 are disposed in the same layer, they are manufactured with the same material, the pixel electrode 204 has a thickness less than that of the source/drain 203, the pixel electrode 204 is formed with a plurality of slits, and the pixel electrode 204 has a transmittance greater than 30%.

Since the gate and the common electrode are made of the same material, it is possible to reduce process complexity. The common electrode with a thickness less than that of the gate guarantees the transmittance of the common electrode. Furthermore, it is possible to manufacture the gate and the common electrode in the same layer by one dual-tone mask, or manufacture the source/drain and the pixel electrode in the same layer by one dual-tone mask, which saves one mask and reduces process complexity and process costs.

For example, the dual-tone mask can be a halftone mask or a gray-tone mask.

Gate material for manufacturing the gate and the common electrode or source/drain material for manufacturing the source/drain and the pixel electrode can be: a single-layer metal film or a multi-layer composite film of Al(aluminum), Cu(copper), Mo(molybdenum), AlNd(aluminum neodymium alloy), Cr(chromium), Ti(titanium), Ag(silver) or a composite film with a metal/medium one dimension photonic crystal structure.

In this embodiment, the common electrode or the pixel electrode has a thickness of 10 Å~100 Å and a transmittance of 30%~90%.

Figure 3A:
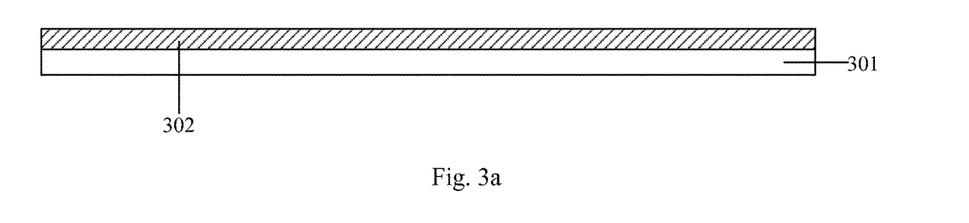
FIGS. 3a-3f are schematic diagrams of a manufacturing process of the array substrate according to one embodiment of the present disclosure.
Figure 3B:
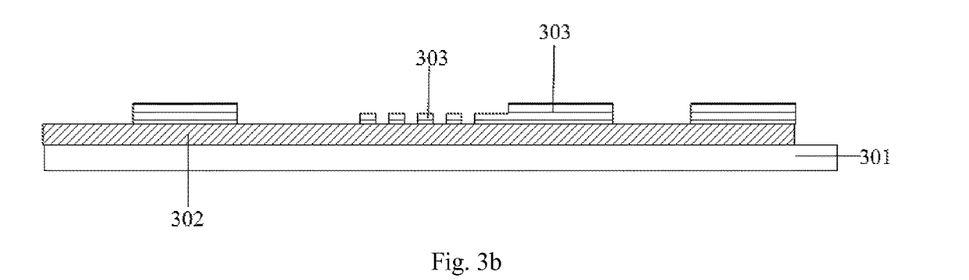
Figure 3C:
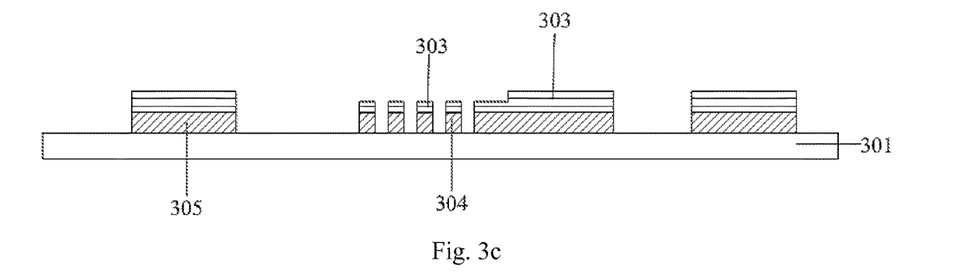
Figure 3D:
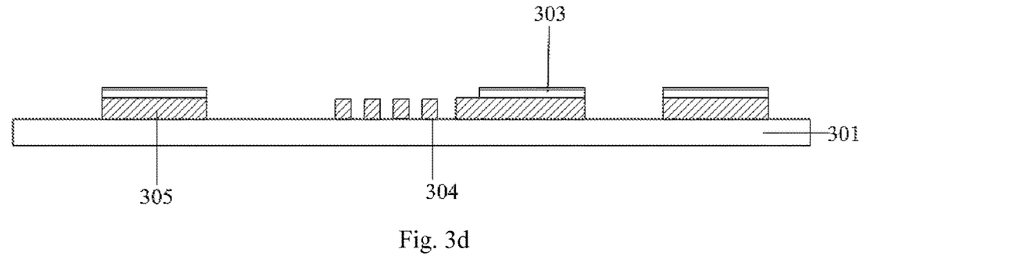
Figure 3E:
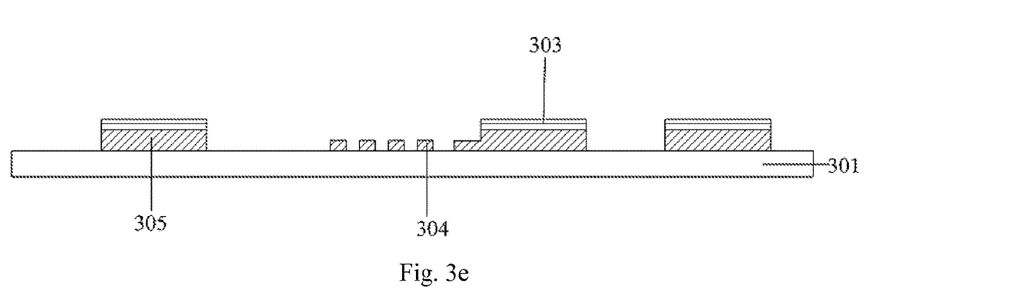
Figure 3F:
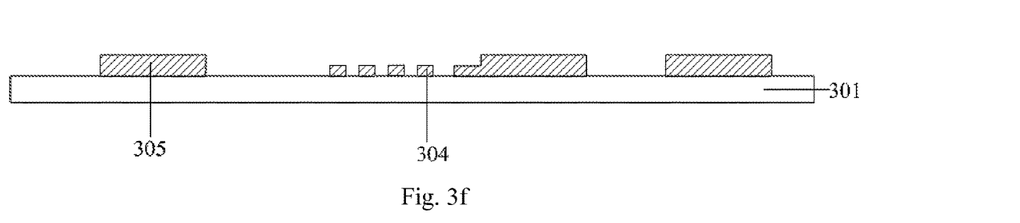

In this embodiment, taking the gate and the common electrode disposed in the same layer as an example, the process steps of forming patterns of the common electrode and the gate with one dual-tone mask comprising:

Step 1: depositing a layer of electrode material 302 on a base substrate 301, as illustrated in FIG. 3a;

Step 2: forming a photoresist layer on the layer of electrode material, and exposing the photoresist layer by a dual-tone masking process to form patterned photoresist 303 with various heights on the electrode material 302, as illustrated in FIG. 3b;

Step 3: etching the electrode material 302 not protected by the photoresist through the first etching process to form a patterned common electrode 304 and a patterned gate 305, as illustrated in FIG. 3c;

Step 4: thinning the photoresist 303 by an ashing process to remove photoresist on the common electrode 304 and expose the common electrode pattern, as illustrated in FIG. 3d;

Step 5: etching common electrode pattern not protected by the photoresist by a second etching process that is controlled strictly such that the common electrode 304 has a thickness of 10 Å~500 Å and a transmittance of 30%~90%, as illustrated in FIG. 3e;

Step 6: stripping the photoresist 303 by a stripping process to complete fabrication of common electrodes 304 and gates 305, as illustrated in FIG. 3f.

Figure 4:
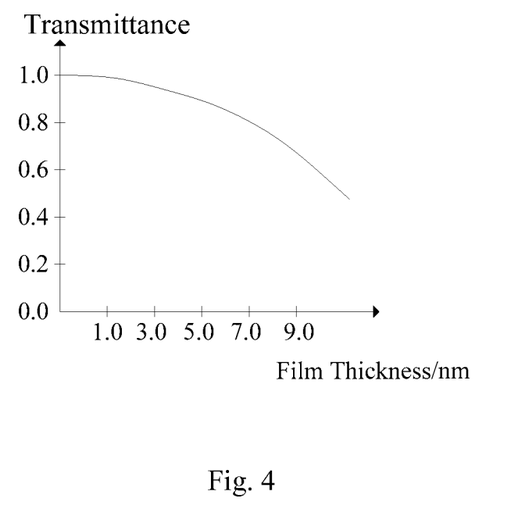
FIG. 4 is a graph of the transmittance of Ag film for the maximum potential vs. a film thickness according to one embodiment of the present disclosure.

The common electrode or the pixel electrode can be obtained by thinning a single-layer metal film of Al, Cu, Mo, AlNd, Cr, Ti and Ag or a composite film consisting of the mentioned material by an etching process. For example, Ag can be used for the gate metal layer, wherein the gate Ag has a thickness of 2000 Å, the Ag in the common electrode part has a thickness of 50 Å, then the transmittance of the common electrode part is about 90%. Transmittance of Ag vs. its thickness is illustrated in FIG. 4.

Figure 5:
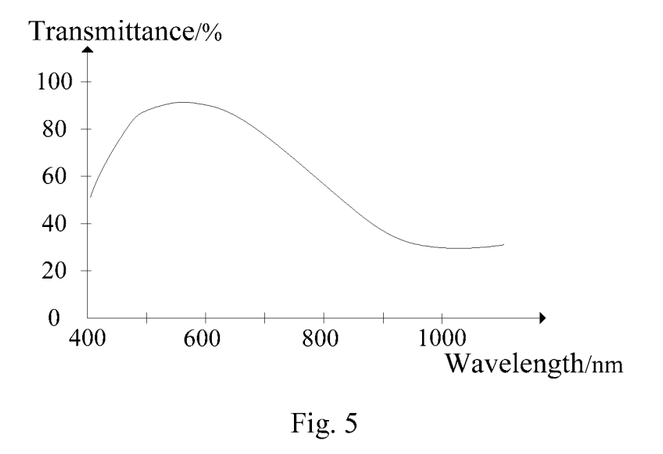
FIG. 5 is a graph of the transmittance of a composite film layer of ZnS, Ag and ZnS vs. a film thickness according to one embodiment of the present disclosure.

A composite film layer with metal/medium one dimension photonic crystal structure can also be used for the gate, for example, a composite film layer of ZnS (zinc sulfide), Ag, ZnS and a metal in sequence, wherein ZnS, Ag, ZnS and Ag are disposed in sequence in the direction pointing to the composite film from the substrate, and a transparent electrode of metal/medium one dimension photonic crystal can be used for the common electrode, for example, a composite film layer of ZnS, Ag and ZnS in sequence, which is obtained by removing the metal film on the surface of the composite film layer of ZnS, Ag, ZnS and a metal in sequence through an etching process. For example, it is possible to use a composite film layer of ZnS, Ag, ZnS and Ag in sequence as a gate, in which thickness of ZnS, Ag, znS and Ag in the gate region is 400 Å, 180 Å, 400 Å and 2000 Å respectively, and thickness of ZnS, Ag and ZnS in the common electrode is 400 Å, 180 Å and 400 Å respectively, and the transmittance curve in visible light range thereof is illustrated in FIG. 5 with the maximum transmittance approaching 90% ($\lambda$=550 nm).

As can be seen, when each of the gate and the common electrode is made of gate metal material with different thicknesses, it is guaranteed that the transmittance of the common electrode part can meet the display demand of an liquid crystal display apparatus of ADS mode, thereby enhancing the display effect of the array substrate.

Further, each of the common electrode and the pixel electrode in the array substrate is formed with a plurality of slits and slits in the common electrode are parallel to slits in the pixel electrode. Since both the common electrode and the pixel electrode have a shape of line, it is possible to reduce storage capacitance between the common electrode and the pixel electrode, and at the same time as the metal material for the common electrode has a shape of line, it is also possible to enhance transmittance of the pixel part to a certain extent.

Still further, it is possible to make projections of slits in the common electrode on the substrate and slits in the pixel electrode on the substrate not to overlap, thereby further reducing the storage capacitance between common electrode and pixel electrode.

Figure 6:
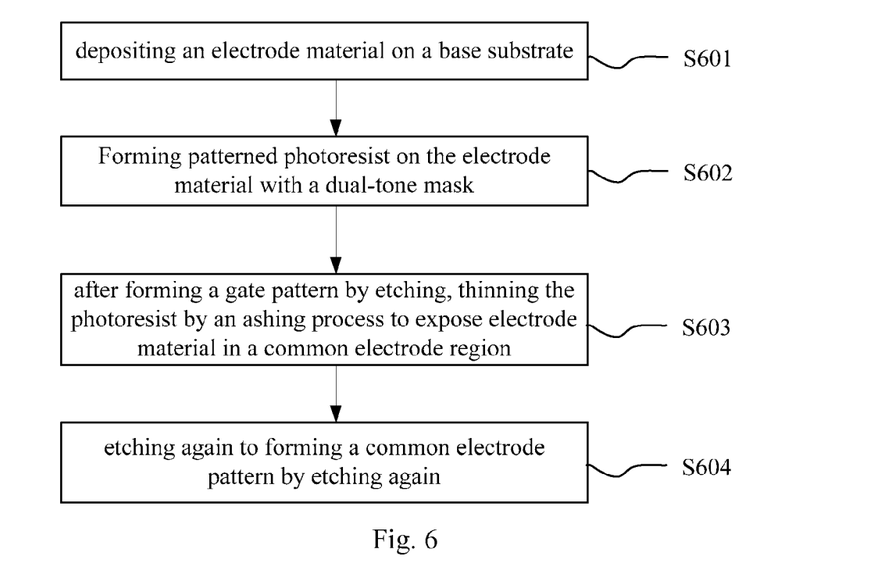
FIG. 6 is a flow chart I of a manufacturing method of the array substrate according to one embodiment of the present disclosure.

As illustrated in FIG. 6, an embodiment of the present disclosure provides a manufacturing method of an array substrate comprising:

Step S601, depositing an electrode material on a base substrate;

Step S602, forming a photoresist layer on the electrode material and forming patterned photoresist on the electrode material with a dual-tone mask;

Step S603, after forming a gate pattern by etching, thinning the photoresist by an ashing process to expose electrode material in a common electrode region;

Step S604, etching again to forming a common electrode pattern by etching again.

For example, the dual-tone mask can be a gray-tone mask or a halftone mask.

Since the gate and the common electrode are made of the same material, it is possible to reduce process complexity. The common electrode with a thickness less than that of the gate guarantees the transmittance of the common electrode. And the method manufactures the gate and the common electrode by one masking, hence saving one mask and simplifying the manufacturing process of the array substrate.

Figure 7:
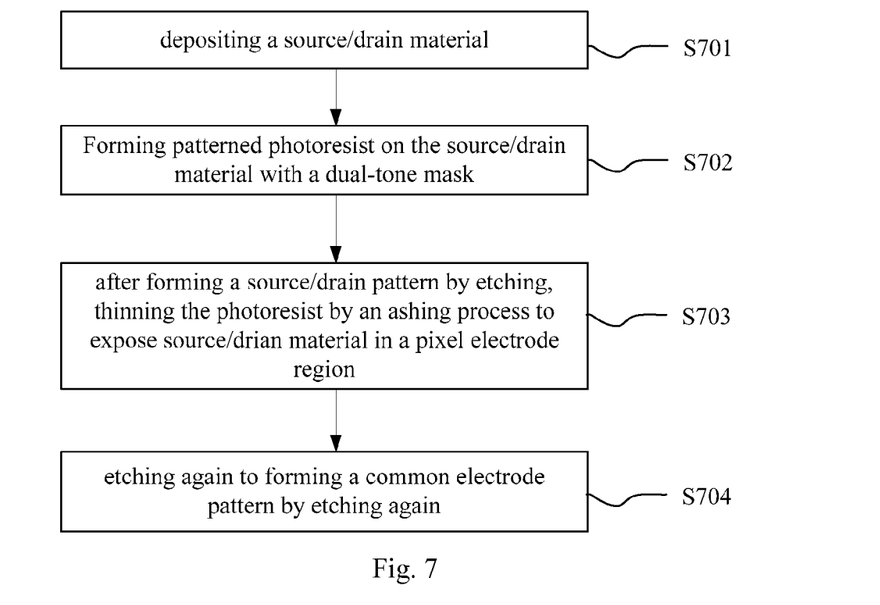
FIG. 7 is a flow chart II of a manufacturing method of the array substrate provided in one embodiment of the present disclosure.

For the array substrate in which the common electrode and the gate are not in the same layer while the pixel electrode and the source/drain are in the same layer, embodiments of the present disclosure further provides a manufacturing method of an array substrate as illustrated in FIG. 7, comprising:

Step S701, depositing a layer of an electrode material;

Step S702, forming a photoresist layer on the electrode material layer and forming patterned photoresist on the electrode material with a dual-tone mask;

Step S703, after forming the source/drain pattern by etching, thinning the photoresist by an ashing process to expose electrode material in a pixel electrode region;

Step S704, forming a pixel electrode pattern through etching again.

For example, the dual-tone mask may be a gray-tone mask or a halftone mask.

In the embodiment, the source/drain and the pixel electrode are manufactured by one masking, hence saving one mask and simplifying the manufacturing process of the array substrate.

An embodiment of the present disclosure further provides a display device including the array substrate provided in the embodiment of the present disclosure.

Embodiments of the present disclosure provide an array substrate, a display device and a manufacturing method of the array substrate in which the pixel electrode has the same material as the source/drain and has a thickness less than that of the source/drain, or the common electrode has the same material as the gate and has a thickness less than that of the gate, thereby ensuring transmittance of the array substrate while decreasing process complexity.

The foregoing are merely exemplary embodiments of the disclosure, but are not used to limit the protection scope of the disclosure. The protection scope of the disclosure shall be defined by the attached claims.

The present application claims priority of a China patent application no. 201410036343.3 filed on Jan. 24, 2014, the disclosure of which is hereby entirely incorporated by reference.

The invention claimed is:

1. An array substrate including a gate, a common electrode, source/drain and a pixel electrode, wherein the gate and the common electrode are disposed in a same layer or the source/drain and the pixel electrode are disposed in a same layer, wherein an entirety of the gate and an entirety of the common electrode are disposed in the same layer, the entirety of the common electrode and the entirety of the gate are made of a same electrode material and a total thickness of the common electrode is less than that of the gate, the common electrode is formed with a plurality of slits, and the common electrode has a transmittance greater than 30%; and wherein an entirety of the source/drain and an entirety of the pixel electrode are disposed in the same layer, the entirety of the pixel electrode and the entirety of the source/drain are made of a same electrode material and a total thickness of the pixel electrode is less than that of the source/drain, the pixel electrode is formed with a plurality of slits, and the pixel electrode has a transmittance greater than 30%.

2. The array substrate of claim 1, wherein the electrode material is a single-layer metal film or a multi-layer composite film of Al, Cu, Mo, AlNd, Cr, Ti, Ag, or a composite film with a metal/medium one-dimension photonic crystal structure.

3. The array substrate of claim 2, wherein the electrode material is a single-layer metal film of Ag, the gate has a thickness of 2000 Å and the common electrode has a thickness of 50 Å.

4. The array substrate of claim 2, wherein the electrode material is a composite film comprising ZnS, Ag, ZnS, and Ag, wherein ZnS, Ag, ZnS, and Ag are disposed in sequence in a direction from the substrate to the composite film, the common electrode or the pixel electrode comprises only a composite layer of ZnS, Ag, and ZnS, and ZnS, Ag, ZnS, and Ag have thicknesses of 400 Å, 180 Å, 400 Å, and 2000 Å, respectively.

5. The array substrate of wherein the common electrode or the pixel electrode has a thickness of 10~100 Å and a transmittance of 30%~90%.

6. The array substrate of claim 1, wherein each of the common electrode and the pixel electrode is formed with a plurality of slits, and
slits in the common electrode and slits in the pixel electrode are parallel to each other.

7. The array substrate of claim 6, wherein projections of slits in the common electrode on the substrate and projections of slits in the pixel electrode on the substrate do not overlap.

8. The array substrate of claim 2, wherein the common electrode or the pixel electrode has a thickness of 10~100 Å and a transmittance of 30%~90%.

9. The array substrate of claim 3, wherein the common electrode or the pixel electrode has a thickness of 10~100 Å and a transmittance of 30%~90%.

10. The array substrate of claim 4, wherein the common electrode or the pixel electrode has a thickness of 10~100 Å and a transmittance of 30%~90%.

11. The array substrate of claim 2, wherein each of the common electrode and the pixel electrode is formed with a plurality of slits, and
slits in the common electrode and slits in the pixel electrode are parallel to each other.

12. The array substrate of claim 3, wherein each of the common electrode and the pixel electrode is formed with a plurality of slits, and
slits in the common electrode and slits in the pixel electrode are parallel to each other.

13. The array substrate of claim 4, wherein each of the common electrode and the pixel electrode is formed with a plurality of slits, and
slits in the common electrode and slits in the pixel electrode are parallel to each other.

14. The array substrate of claim 5, wherein each of the common electrode and the pixel electrode is formed with a plurality of slits, and
slits in the common electrode and slits in the pixel electrode are parallel to each other.

15. The array substrate of claim 11, wherein projections of slits in the common electrode on the substrate and projections of slits in the pixel electrode on the substrate do not overlap.

16. The array substrate of claim 12, wherein projections of slits in the common electrode on the substrate and projections of slits in the pixel electrode on the substrate do not overlap.

17. The array substrate of claim 13, wherein projections of slits in the common electrode on the substrate and projections of slits in the pixel electrode on the substrate do not overlap.

18. The array substrate of claim 14, wherein projections of slits in the common electrode on the substrate and projections of slits in the pixel electrode on the substrate do not overlap.

* * * * *